US012752653B2

(12) United States Patent
Haehre et al.

(10) Patent No.: US 12,752,653 B2
(45) Date of Patent: Oct. 6, 2026

(54) METHOD FOR CONTROLLING A CHARGING DEVICE

(71) Applicant: Dr. Ing. h.c. F. Porsche Aktiengesellschaft, Stuttgart (DE)

(72) Inventors: Karsten Haehre, Reinbek (DE); Christian Metzger, Tamm (DE)

(73) Assignee: Dr. Ing. h.c. F. Porsche Aktiengesellschaft, Stuttgart (DE)

( * ) Notice: Subject to any disclaimer, the term of this patent is extended or adjusted under 35 U.S.C. 154(b) by 845 days.

(21) Appl. No.: 17/549,055

(22) Filed: Dec. 13, 2021

(65) Prior Publication Data

US 2022/0190627 A1 Jun. 16, 2022

(30) Foreign Application Priority Data

Dec. 14, 2020 (DE) ..................... 10 2020 133 306.4

(51) Int. Cl.
*B60L 53/302* (2019.01)
*H02J 7/90* (2026.01)
(Continued)

(52) U.S. Cl.
CPC ............ *B60L 53/302* (2019.02); *H02J 7/975* (2026.01); *H02M 1/327* (2021.05); (Continued)

(58) Field of Classification Search
CPC ............... B60L 53/302; H02J 7/007192; H02J 2310/48; H02M 1/327; H05K 7/20845; H01L 23/34; H01M 10/625
(Continued)

(56) References Cited

U.S. PATENT DOCUMENTS

| | | | |
|---|---|---|---|
| 6,060,792 | A | 5/2000 | Pelly |
| 7,671,571 | B2 | 3/2010 | Burlak et al. |

(Continued)

FOREIGN PATENT DOCUMENTS

| | | | | |
|---|---|---|---|---|
| CN | 112092658 | A * | 12/2020 | ............... A62C 3/16 |
| DE | 10213617 | A1 * | 6/2003 | ............. H02P 29/02 |

(Continued)

OTHER PUBLICATIONS

"Comparison analysis of loss calculation methods and measurement techniques in power electronics and motor systems," 2013 International Conference on Electrical Machines and Systems (ICEMS), Busan, Korea (South), 2013, pp. 530-534, doi: 10.1109/ICEMS.2013.6713118 (Year: 2013) https://ieeexplore.ieee.org/document/6.*

(Continued)

*Primary Examiner* — Julian D Huffman
*Assistant Examiner* — Johali A Torres Ruiz
(74) *Attorney, Agent, or Firm* — Buchanan Ingersoll & Rooney PC

(57) ABSTRACT

A method is provided for controlling a charging device (1) for charging energy stores (2). A charging electronics system (6) has a power electronics system (7). A cooling device (9) has at least one first temperature sensor (12) for ascertaining the temperature of a barrier layer of a power semiconductor in the power electronics system (7), at least one second temperature sensor (13, 14) for ascertaining the temperature of the coolant, means for determining input power and output power of the charging electronics system (6). At least the first temperature sensor (12) is monitored to ascertain a rate of change of the temperature of the barrier layer of the power semiconductors. The power loss of the charging electronics system (6) is controlled to limit the rate of
(Continued)

change of the temperature of the barrier layer to ensure that a maximum temperature of the barrier layer is not exceeded.

13 Claims, 2 Drawing Sheets

(51) Int. Cl.

| | |
|---|---|
| ***H02M 1/32*** | (2007.01) |
| ***H05K 7/20*** | (2006.01) |
| *H01M 10/625* | (2014.01) |
| *H02J 105/37* | (2026.01) |
| *H10W 40/00* | (2026.01) |

(52) U.S. Cl.
CPC ....... *H05K 7/20845* (2013.01); *H01M 10/625* (2015.04); *H02J 2105/37* (2026.01); *H10W 40/00* (2026.01)

(58) Field of Classification Search
USPC .......................................................... 320/137
See application file for complete search history.

(56) References Cited

U.S. PATENT DOCUMENTS

| | | | | |
|---|---|---|---|---|
| 7,755,313 | B2 | 7/2010 | Son et al. | |
| 10,131,235 | B2 * | 11/2018 | Weidinger | B60L 53/31 |
| 10,195,954 | B2 * | 2/2019 | Becker | B60L 3/0023 |
| 10,981,457 | B2 | 4/2021 | Goetz et al. | |
| 11,527,947 | B2 * | 12/2022 | Iwabuki | H02M 1/0048 |
| 2011/0246105 | A1 * | 10/2011 | Ley | G01K 15/00 702/60 |
| 2015/0054462 | A1 * | 2/2015 | Weidinger | H02J 7/977 320/109 |
| 2016/0009191 | A1 * | 1/2016 | Becker | B60L 53/14 320/152 |
| 2016/0254212 | A1 * | 9/2016 | Kusaka | H10W 40/47 361/699 |
| 2017/0297431 | A1 * | 10/2017 | Epstein | F02N 19/10 |
| 2018/0331017 | A1 | 11/2018 | Straber | |
| 2020/0177010 | A1 | 6/2020 | Tamoto | |
| 2021/0063467 | A1 * | 3/2021 | Kazmirski | G01R 31/007 |
| 2021/0313870 | A1 * | 10/2021 | Iwabuki | H02M 1/007 |

FOREIGN PATENT DOCUMENTS

| | | | | |
|---|---|---|---|---|
| GB | 2579690 | A * | 7/2020 | H02J 7/977 |
| JP | 2011243888 | | 12/2011 | |

OTHER PUBLICATIONS

German Search Report dated Feb. 1, 2023.

* cited by examiner

METHOD FOR CONTROLLING A CHARGING DEVICE

CROSS REFERENCE TO RELATED APPLICATION

This application claims priority under 35 USC 119 to German Patent Appl. No. 10 2020 133 306.4 filed on Dec. 14, 2020, the entire disclosure of which is incorporated herein by reference.

BACKGROUND

Field of the Invention

The invention relates to a method for controlling a charging device, in particular a charging device for charging motor vehicles.

Related Art

Motor vehicles having an electric drive, for example electric vehicles or hybrid vehicles, are known. These motor vehicles have an electrical energy store, e. g. a battery, that can be charged by a charging device so that the electrical energy charged in the electrical energy store can be used to drive the motor vehicle.

Charging devices, such as charging stations or charging columns, have a first electrical connection for the input-side power supply, a second electrical connection for the output-side power supply and a charging electronics system having a power electronics system. The first electrical connection for the input-side power supply is used to supply electrical power to the charging device, for example by way of an AC connection to an AC power grid. The second electrical connection for the output-side power supply is used to supply electrical power to a connected electrical energy store, such as a motor vehicle, for example by way of an AC connection or a DC connection to the electrical energy store. The charging electronics system having the integrated power electronics system of the charging device is used to control the output-side charging current and the output-side charging voltage, and also to cool the charging device and the components thereof, such as the power electronics system of the charging electronics system.

A temperature of the charging device, a coolant temperature in the feed line of the charging device and a coolant temperature in the return line of the charging device typically are monitored. In this case, if the monitored temperatures of the charging device or of the coolant reach a limit value, the output-side charging current or the output power is reduced or shut down. The shutdown also is performed when the maximum barrier layer temperature of the power semiconductors in the power electronics system is exceeded or when the relative temperature difference between the temperature of the power electronics system or the barrier layer temperature and the coolant temperature exceeds a limit value. In this case, it is assumed that the cooling is not functioning as intended.

A shutdown also is performed when the coolant temperature in the feed line equals the coolant temperature in the return line during a charging operation above a defined load point because it is assumed that the cooling system is faulty or impaired.

However, shutdown times of the charging device due to thermal effects or due to problems with the cooling can prevent a customer from using the charging device as often as possible and for as long as possible to charge the energy store of their motor vehicle, and therefore such shutdowns are undesired.

It is the object of the invention to provide a method for controlling a charging device to achieve a high availability of the charging device.

SUMMARY

One aspect of the invention relates to a method for controlling a charging device, in particular a charging device for charging energy stores of motor vehicles. The charging device has a first electrical connection for the input-side power supply of the charging device, a second electrical connection for the output-side power supply of a device that is to be charged, a charging electronics system having a power electronics system and a cooling device. The cooling device has a coolant feed line, a coolant return line, and at least one first temperature sensor for ascertaining the temperature of the barrier layer of the power semiconductor in the power electronics system. At least one second temperature sensor may be provided for ascertaining the temperature of the coolant. The charging device further has means for determining the input power of the charging electronics system and means for determining the output power of the charging electronics system. At least the first temperature sensor is monitored discretely in terms of time to ascertain a rate of change of the temperature of the barrier layer of the power semiconductors in the power electronics system. The power loss of the charging electronics system is controlled or regulated so that the rate of change of the temperature of the barrier layer is limited to ensure that a maximum temperature of the barrier layer is not exceeded. Therefore, even in the event of a failure of the cooling or a restriction of the cooling of the charging device, the charging device can continue to be operated, albeit possibly with reduced power. However, the charging device remains available for use by customers. In this case, the power loss is reduced, for example, to reduce the rate of change of temperature.

In one embodiment, the power loss of the charging electronics system is determined from the difference between the output power of the charging electronics system and the input power of the charging electronics system. This power loss can be introduced into the drive system of the charging electronics system to limit the rate of change of the temperature of the barrier layer so that a maximum temperature of the barrier layer is not exceeded.

In another embodiment, the charging electronics system having the power electronics system is used to control the output power via the output-side charging current and the output-side charging voltage, that is to say the output power. The output power is limited and/or reduced by limiting and/or reducing the output-side charging voltage and/or the output-side charging current. Such an adjustment can reduce the power loss, thereby reducing the rate of change of the temperature of the barrier layer and delaying or avoiding exceeding a limit temperature of the temperature of the barrier layer. As a result, the charging device is available for a longer time or permanently for customers for the purpose of charging.

The at least one second temperature sensor may be provided to ascertain the temperature of the coolant at the coolant feed line or at the coolant return line or between the coolant feed line and the coolant return line. Alternatively, two second temperature sensors may be provided to ascertain the temperature of the coolant at the coolant feed line and at the coolant return line. The temperature of the coolant measured by the one or more second temperature sensors can be taken into account when ascertaining a rate of change of the respective temperature and/or the temperature of the barrier layer to prevent a shutdown of the charging device.

The at least one first temperature sensor for ascertaining the temperature of the barrier layer of the power semiconductors in the power electronics system may be provided at an element of the power electronics system, such as a circuit breaker, to measure the temperature of the power electronics system directly. Alternatively, the at least one first temperature sensor for ascertaining the temperature of the barrier layer of the power semiconductors in the power electronics system may be provided at a cooling element of the power electronics system to measure the temperature of the power electronics system indirectly. It is thus possible to measure or calculate or estimate the relevant temperature of the barrier layer and a change of the rate of temperature of the barrier layer with a sufficient degree of accuracy.

A characteristic map be used to control or regulate the power loss of the charging electronics system on the basis of measurement values. As a result, for example, at least one value of the characteristic map can be determined for many operating points or for each operating point so that the power loss can be controlled to keep the barrier layer below a limit temperature.

The characteristic map comprises data of at least one of the following variables: output current of the charging electronics system, output voltage of the charging electronics system, output power of the charging electronics system, input current of the charging electronics system, input voltage of the charging electronics system, input power of the charging electronics system, power loss of the charging electronics system, temperature of the coolant, temperature of the coolant at the coolant feed line, temperature of the coolant at the coolant return line, temperature of a barrier layer of the power semiconductors in the power electronics system, temperature of a heat sink, at least one limit value or limit values for at least one such variable from temperature, voltage, current, power, and for a maximum permissible rate of change, in particular for one operating state or for various operating states. As a result, depending on the selection of the variables, it is possible to achieve good coverage of the availability of the charging device without a large number of shutdowns or without any shutdowns at all resulting.

A temperature controller is used in some embodiments and is superordinate to a provided current and voltage controller as limit value controller. As a result, it is also possible to achieve good coverage of the availability of the charging device without a large number of shutdowns or without any shutdowns resulting.

The temperature controller may account for the maximum occurring rates of change of the at least one temperature or temperatures and thus, where necessary, takes into account stipulated limit values for the at least one rate of change. Therefore, it is possible to perform regulation to bring about appropriately adjusted rates of change on the basis of the limit values so that the limit values are not exceeded.

The temperature controller may be a PID controller, a state controller with an observer and/or a fuzzy logic controller. Thus, rapid and accurate regulation methods can be implemented to avoid exceeding the limit values.

The invention is discussed in detail below on the basis of an exemplary embodiment and with reference to the drawing.

DETAILED DESCRIPTION

Figure 1:
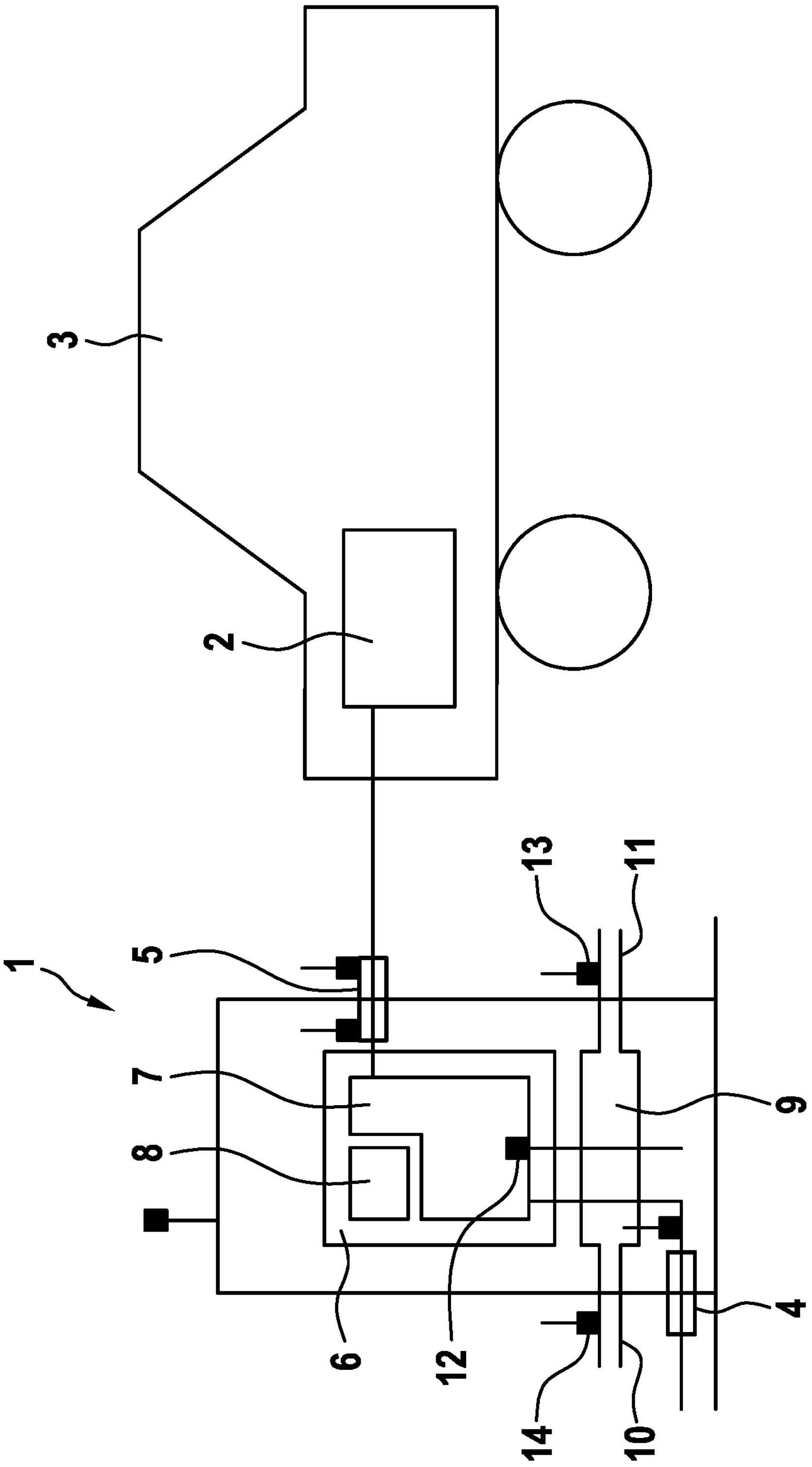
FIG. 1 is a schematic illustration of a charging device for charging an energy store of a motor vehicle.

The invention relates to a method for controlling a charging device 1 for charging energy stores 2 of motor vehicles 3. The energy store 2 that is to be charged may also be installed at a location other than in a motor vehicle 3, for example in a bicycle, aircraft, building etc. The charging device 1 may be a charging column, a charging station or otherwise, for example on its own or as part of a charging park with several charging devices 1.

FIG. 1 is a schematic illustration of a charging device 1 for charging energy stores 2 of motor vehicles 3. The charging device 1 has a first electrical connection 4 for the input-side power supply of the charging device 1. As a result, the charging device 1 may be connected, for example, to an AC power supply, an AC power grid and/or a DC power supply or a DC power grid or another electrical supply station.

The charging device 1 also has a second electrical connection 5 for the output-side power supply of a device that is to be charged, such as an electrical energy store 2. This electrical connection may be produced using a charging cable between the second electrical connection 5 and the energy store 2 or the motor vehicle 3.

The charging device 1 has a charging electronics system 6 with a power electronics system 7 and optionally with a control electronics system 8. The power electronics system 7 controls the output current and the output voltage and optionally also the input current and the input voltage. For this purpose, the power electronics system 7 may have electronic circuit breakers that can be actuated by the control electronics system 8.

In connection with this disclosure, a "control electronics system" can be understood as meaning, for example, a machine or an electronic circuit or a powerful computer. A control electronics system may be a main processor (Central Processing Unit, CPU), a microprocessor or a microcontroller, for example an application-specific integrated circuit or a digital signal processor, possibly in combination with a memory unit for storing program instructions, etc. A control electronics system may also be understood as meaning a virtualized processor, a virtual machine or a soft CPU. It may also be a programmable processor equipped with configuration steps for carrying out the method disclosed herein or may be configured with configuration steps in such a manner that the programmable processor implements the features of the disclosed method, of the component, of the modules or of other aspects and/or partial aspects of the invention. Highly parallel computing units and powerful graphics modules also be provided.

A cooling device 9 is provided and has a coolant feed line 10 and a coolant return line 11. The cooling device 9 is in thermal contact with at least the power electronics system 7 to be able to cool the power electronics system 7 and the components thereof. The cooling device 9 can be supplied with a liquid or gaseous coolant, and an integrated pump and/or an external pump may be provided to control the coolant flow through the cooling device 9.

At least one first temperature sensor 12 is provided to ascertain the temperature of the barrier layer of the power semiconductors in the power electronics system 7.

At least one second temperature sensor 13, 14 also may be provided to ascertain the temperature of the coolant. For example, a second temperature sensor 13, 14 may be provided to detect the temperature of the coolant at a defined location in the cooling device 9. Second temperature sensors 13, 14 also may be provided respectively at the coolant feed line 10 and at the coolant return line 11. One second temperature sensor 13, 14 optionally is provided to ascertain the temperature of the coolant at the coolant feed line 10 or at the coolant return line 11 or between the coolant feed line 10 and the coolant return line 11. Alternatively, two second temperature sensors 13, 14 may be provided to ascertain the temperature of the coolant at the coolant feed line 10 and also at the coolant return line 11.

Means for determining the input power of the charging electronics system 6 and means for determining the output power of the charging electronics system 6 also are provided and may be in the control electronics system 8. The means for determining the input power of the charging electronics system 6 and means for determining the output power of the charging electronics system 6 may comprise a commercially available instrument that measures the charging current that flows from the charging device 1 and/or may comprise a commercially available voltage measuring apparatus.

In this case, at least the first temperature sensor 12 is monitored discretely in terms of time to ascertain the temperature and a rate of change of the temperature of the barrier layer of the power electronics system 7.

The power loss, in particular the difference between the input power and the output power of the charging electronics system 6, is controlled so that the rate of change of the temperature of the barrier layer is limited to avoid exceeding a maximum temperature of the barrier layer. For example, the charging electronics system 6 having the power electronics system 7 and the control electronics system 8 may be used to control the output power via the output-side charging current and the output-side charging voltage. The output power is limited and/or reduced by limiting and/or reducing the output-side charging voltage and/or the output-side charging current.

The at least one first temperature sensor 12 may be provided to ascertain the temperature of the barrier layer of the power semiconductors in the power electronics system 7 at an element of the power electronics system 7, such as at a circuit breaker, for directly measuring the temperature of the power electronics system 7. As an alternative or in addition, the at least one first temperature sensor 12 may be provided to ascertain the temperature of the barrier layer of the power semiconductors in the power electronics system 7 at a cooling element of the power electronics system 7 for indirectly measuring the temperature of the power electronics system 7.

A characteristic map may be used to control the power loss of the charging electronics system 7 on the basis of measurement values. The characteristic map may comprise data of at least one of the following variables: output current of the charging electronics system 7, output voltage of the charging electronics system 7, output power of the charging electronics system 7, input current of the charging electronics system 7, input voltage of the charging electronics system 7, input power of the charging electronics system 7, power loss of the charging electronics system 7, temperature of the coolant, temperature of the coolant at the coolant feed line 10, temperature of the coolant at the coolant return line 11, temperature of a barrier layer, temperature of a heat sink, at least one limit value or limit values for at least one such variable from temperature, voltage, current, power, and for a maximum permissible rate of change, in particular for one operating state or for various operating states.

Figure 2:
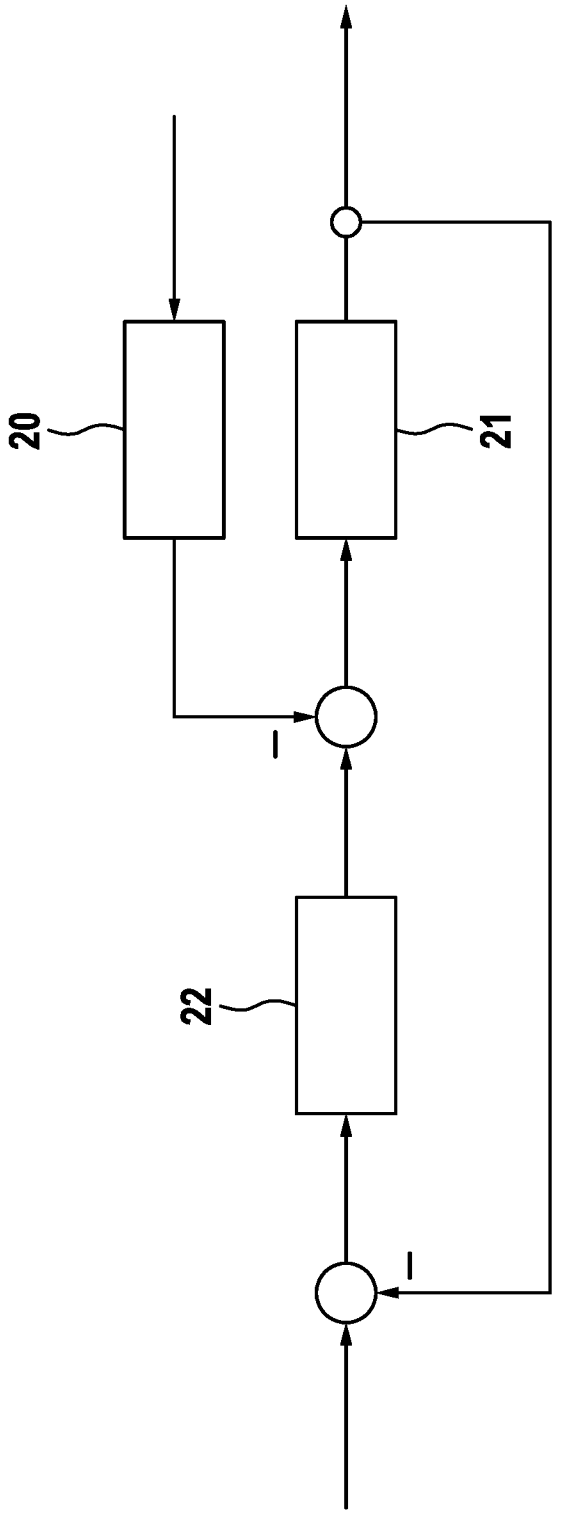
FIG. 2 is a block diagram of a controller for carrying out an alternative of the method according to the invention.

A temperature controller 20 that is superordinate to a current and voltage controller 21, 22 also may be used as limit value controller, see FIG. 2. The temperature controller 20 may take into account the maximum occurring rates of change of the at least one temperature or the temperatures and thus where necessary may take into account stipulated limit values for the at least one rate of change.

The temperature controller 20 may be a PID controller, a state controller with an observer and/or as a fuzzy logic controller.

LIST OF REFERENCE SIGNS

1 Charging device
2 Energy store
3 Motor vehicle
4 First electrical connection
5 Second electrical connection
6 Charging electronics system
7 Power electronics system
8 Control electronics system
9 Cooling device
10 Coolant feed line
11 Coolant return line
12 First temperature sensor
13 Second temperature sensor
14 Second temperature sensor
20 Temperature controller
21 Current controller
22 Voltage controller

What is claimed is:

1. A method for controlling a charging device having a first electrical connection for an input-side power supply of the charging device, a second electrical connection for an output-side power supply of a device that is to be charged, a charging electronics system having a power electronics system, a cooling device having a coolant feed line and a coolant return line, at least one first temperature sensor for ascertaining a temperature of a barrier layer of power semiconductors in the power electronics system, two second temperature sensors disposed respectively at the coolant feed line and the coolant return line for ascertaining a temperature of a coolant, means for determining an input power of the charging electronics system and means for determining an output power of the charging electronics system, the method comprising:

discretely monitoring the at least one first temperature sensor in terms of time to directly ascertain a rate of change of the temperature of the barrier layer of the power semiconductors in the power electronics system, and discretely monitoring, in terms of time, the two second temperature sensors disposed respectively at the coolant feed line and the coolant return line for indirectly ascertaining a rate of change of the temperature of the barrier layer of the power semiconductors in the power electronics system;

calculating a relative temperature difference between readings of the first temperature sensor and readings of the second temperature sensors to identify whether the cooling device is functioning or malfunctioning; and controlling a power loss of the charging electronics system so that the rate of change of the temperature of the barrier layer is limited sufficiently to permit continued operation of the charging device without a maximum temperature of the barrier layer being exceeded;

said controlling the power loss of the charging electronics system comprising (i) reducing a charging current at the output-side power supply without shutting down the charging device when readings of the first temperature sensor reach a first limit value, and (ii) reducing the charging current at the output-side power supply without shutting down the charging device when readings of one of the second temperature sensors reach a second limit value.

2. The method of claim 1, further comprising determining the power loss of the charging electronics system from a difference between the output power of the charging electronics system and the input power of the charging electronics system.

3. The method of claim 1, further comprising: using the charging electronics system having the power electronics system to control the output power via an output-side charging current and an output-side charging voltage; and limiting or reducing the output-side charging voltage and/or the output-side charging current to limit or reduce the output power.

4. The method of claim 1, further comprising providing the at least one first temperature sensor at an element of the power electronics system for directly measuring the temperature of the power electronics system and thereby ascertaining the temperature of the barrier layer of the power semiconductors in the power electronics system.

5. The method as claim 1, further comprising using a characteristic map for controlling the power loss of the charging electronics system on the basis of measurement values.

6. The method of claim 5, wherein the characteristic map comprises data of at least one of the following variables: output current of the charging electronics system, output voltage of the charging electronics system, output power of the charging electronics system, input current of the charging electronics system, input voltage of the charging electronics system, input power of the charging electronics system, power loss of the charging electronics system, temperature of the coolant, temperature of the coolant at the coolant feed line, temperature of the coolant at the coolant return line, temperature of a barrier layer, temperature of a heat sink, at least one limit value or limit values for at least one such variable from temperature, voltage, current, power, and for a maximum permissible rate of change, in particular for one operating state or for various operating states.

7. The method of claim 5, wherein the characteristic map comprises data of the following variables: output current of the charging electronics system, output voltage of the charging electronics system, output power of the charging electronics system, input current of the charging electronics system, input voltage of the charging electronics system, input power of the charging electronics system, power loss of the charging electronics system, the temperature of the coolant, and the temperature of the barrier layer.

8. The method of claim 1, further comprising using a temperature controller that is superordinate to current and voltage controllers as a limit value controller.

9. The method of claim 8, wherein the temperature controller takes into account maximum occurring rates of change of the temperatures by the at least one first temperature sensor and the two second temperature sensors and thus where necessary takes into account stipulated limit values for the at least one rate of change.

10. The method of claim 8, wherein the temperature controller is a PID controller, a state controller with an observer or a fuzzy logic controller.

11. The method of claim 1 further comprising shutting down the charging device when readings of the second temperature sensors are equal.

12. The method of claim 1, wherein the means for determining the input power of the charging electronics system and the means for determining an output power of the charging electronics system each comprise an instrument for measuring current flow from the charging device.

13. The method of claim 1, wherein the at least one first temperature sensor is arranged at either a circuit breaker or a cooling element of the power electronics system.

* * * * *